(12) United States Patent
Omoto

(10) Patent No.: US 9,099,418 B2
(45) Date of Patent: Aug. 4, 2015

(54) DISPLAY PANEL, DISPLAY DEVICE, AND ELECTRONIC INSTRUMENT

(75) Inventor: Keisuke Omoto, Kanagawa (JP)

(73) Assignee: JOLED INC. (JP)

( * ) Notice: Subject to any disclaimer, the term of this patent is extended or adjusted under 35 U.S.C. 154(b) by 518 days.

(21) Appl. No.: 13/419,786

(22) Filed: Mar. 14, 2012

(65) Prior Publication Data

US 2012/0249515 A1 Oct. 4, 2012

(30) Foreign Application Priority Data

Mar. 29, 2011 (JP) ................................. 2011-072246

(51) Int. Cl.
*G09G 5/00* (2006.01)
*H01L 27/32* (2006.01)

(52) U.S. Cl.
CPC .......... *H01L 27/3272* (2013.01); *H01L 27/323* (2013.01)

(58) Field of Classification Search
None
See application file for complete search history.

(56) References Cited

U.S. PATENT DOCUMENTS

| 2007/0182885 | A1* | 8/2007 | Egi et al. | 349/96 |
| 2009/0111247 | A1* | 4/2009 | Tanaka et al. | 438/479 |
| 2009/0135111 | A1* | 5/2009 | Yamamoto et al. | 345/76 |
| 2009/0279013 | A1* | 11/2009 | Kang et al. | 349/48 |
| 2011/0085635 | A1* | 4/2011 | Koyama | 377/78 |
| 2011/0089416 | A1* | 4/2011 | Yamazaki et al. | 257/43 |
| 2011/0170029 | A1* | 7/2011 | Kimura | 349/38 |

FOREIGN PATENT DOCUMENTS

JP 2008-083272 4/2008

* cited by examiner

*Primary Examiner* — Adam R Giesy
*Assistant Examiner* — Henok Heyi
(74) *Attorney, Agent, or Firm* — Sheridan Ross P.C.

(57) ABSTRACT

A display panel includes, for each pixel, a self light emitting device and a pixel circuit driving the self light emitting device. The pixel circuit has a retention capacitor, a first transistor writing a voltage corresponding to a video signal in the retention capacitor, and a second transistor driving the self light emitting device based on the voltage of the retention capacitor, and the display panel has a light exit face discharging a light emitted from the self light emitting device to outside and also has a light blocking layer blocking an external light introduced from the light exit face to the first transistor.

12 Claims, 12 Drawing Sheets

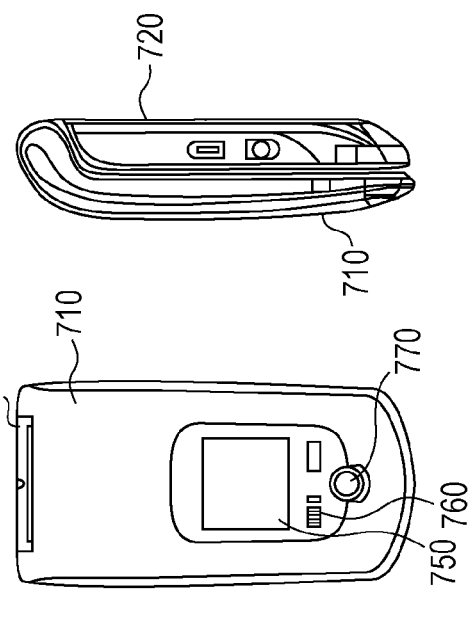
FIG. 14E
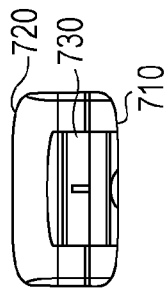
FIG. 14F
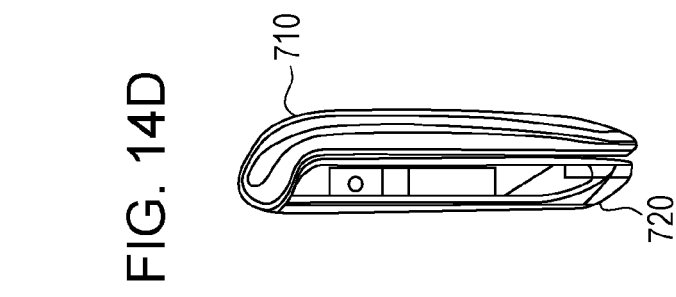
FIG. 14C
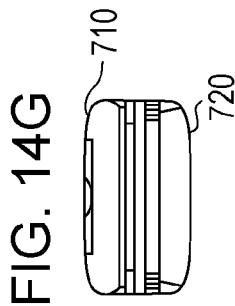
FIG. 14G
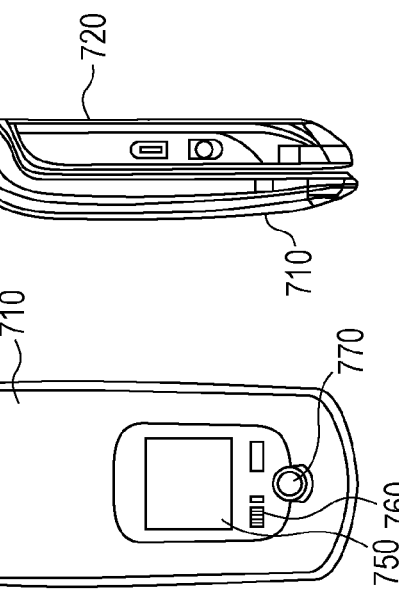
FIG. 14D
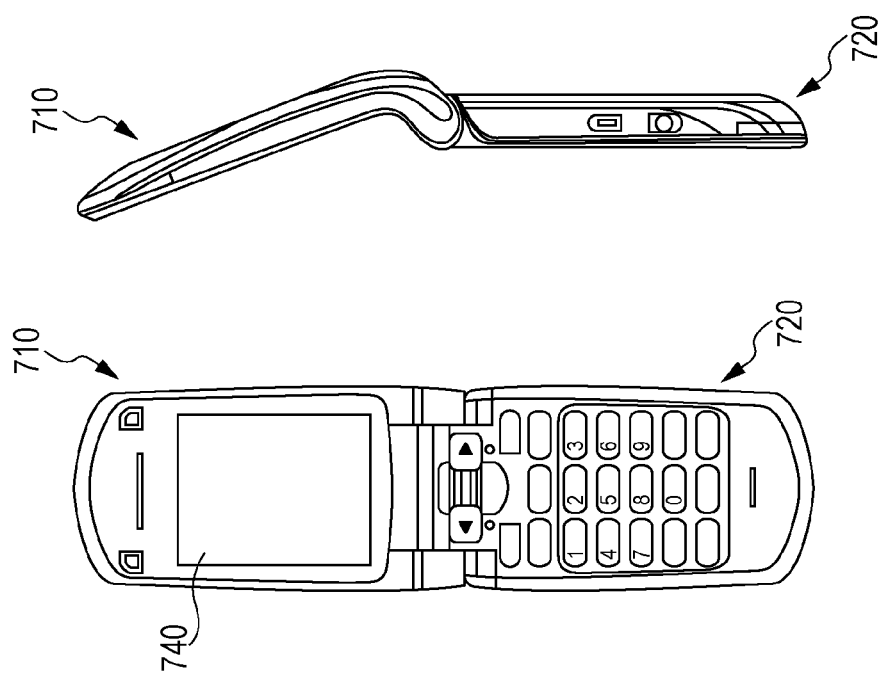
FIG. 14B
FIG. 14A

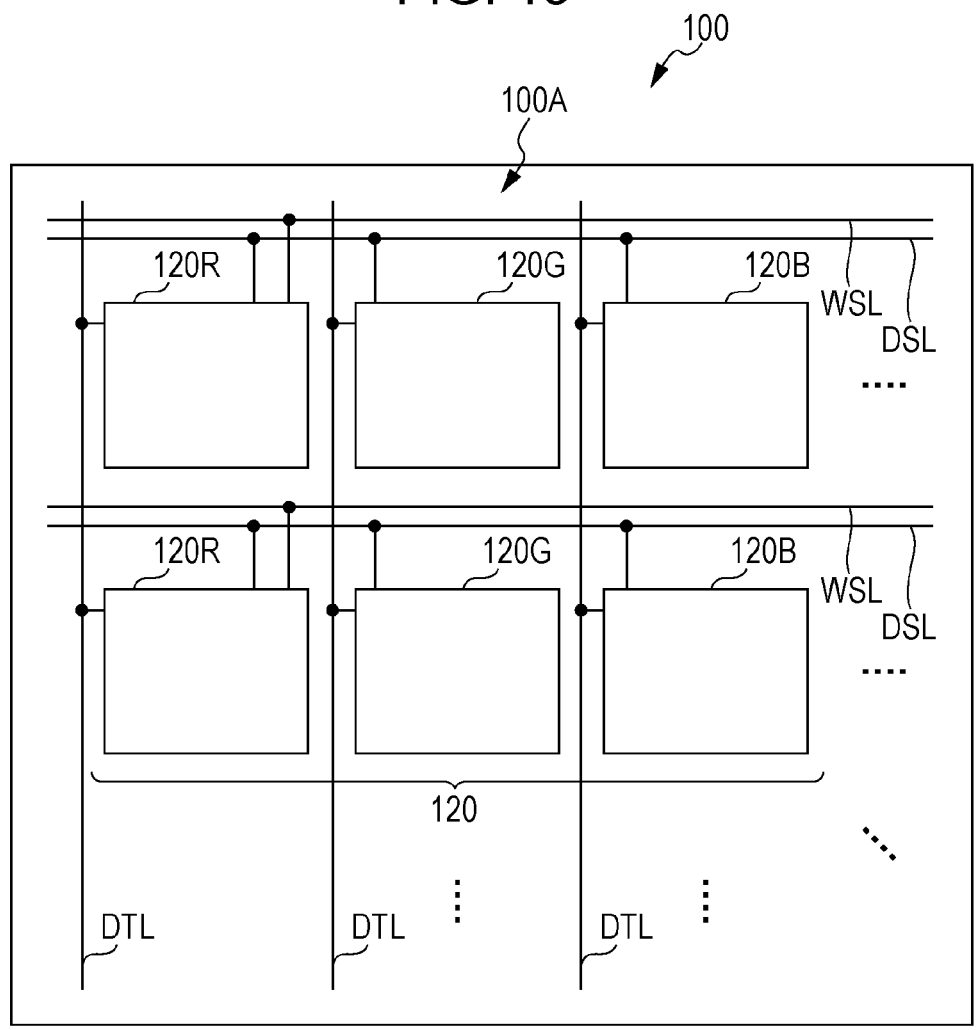

DISPLAY PANEL, DISPLAY DEVICE, AND ELECTRONIC INSTRUMENT

BACKGROUND

The present disclosure relates to a display panel provided with an organic EL (electroluminescent) device, and to a display device and an electronic instrument provided with the display panel.

In recent years, in the field of display devices carrying out image display, current driven optical devices having light emission brightness changed in accordance with a flowing current value, for example, display devices using an organic EL device are developed as a light emitting device for a pixel to pursue commercialization (for example, refer to Japanese Unexamined Patent Application Publication No. 2008-083272). An organic EL device is a self light emitting device, different from a liquid crystal device and the like. Therefore, since a display device using an organic EL device (organic EL display device) does not seek a light source (back light), the visibility of an image is high, the power consumption is low, and also the response speed of a device is fast compared with a liquid crystal display device seeking a light source.

In organic EL display devices, similar to liquid crystal display devices, there are a simple (passive) matrix system and an active matrix system as a driving system thereof. While the passive matrix system has a simple structure, it has problems such that it is difficult to realize a display device of large scale and high resolution. Therefore, currently, development of the active matrix system is carried out extensively. This system controls a current flowing in a light emitting device disposed for each pixel with an active device (TFT (thin film transistor) in general) equipped in a driving circuit equipped for each light emitting device.

FIG. 15 represents a schematic configuration of a general organic EL display panel. A display panel 100 illustrated in FIG. 15 is provided with a display region 100A with a plurality of display pixels 120 two dimensionally arranged therein.

Each display pixel 120 is configured to include a subpixel 120R for a red color, a subpixel 120G for a green color, and a subpixel 120B for a blue color. The subpixels 120R, 120G, and 120B are configured with, as shown in FIG. 16, organic EL devices 121R, 121G, and 121B and a pixel circuit 122 connected thereto. FIG. 16 represents a circuit configuration of the subpixels 120R, 120G, and 120B. Hereinafter, a subpixel 120 is used as a generic name of the subpixels 120R, 120G, and 120B. In addition, an organic EL device 121 is used as a generic name of the organic EL devices 121R, 121G, and 121B.

The pixel circuit 122 is configured with a writing transistor Tws, a retention capacitor Cs, and a driving transistor Tdr and has a circuit configuration of 2Tr1C. A gate line WSL is formed to extend in a row direction and is connected to a gate 123A of the writing transistor Tws. A drain line DSL is also formed to extend in a row direction and is connected to a drain 124C of the driving transistor Tdr. A signal line DTL is formed to extend in a column direction and is connected to a drain 123C of the writing transistor Tws. A source 123B of the writing transistor Tws is connected to a gate 124A of the driving transistor Tdr and one end (terminal 125A) of the retention capacitor Cs. A source 124B of the driving transistor Tdr and the other end (terminal 125B) of the retention capacitor Cs are connected to an anode 127A of the organic EL device 121. A cathode 127B of the organic EL device 121 is connected to an external cathode line CTL.

SUMMARY

In a case that the above subpixel 120 has a bottom emission structure, the writing transistor Tws is arranged on a light emitting face side and an external light introduced from the light emitting face can be introduced directly to the writing transistor Tws. Normally, in a case of introducing a light to a transistor, as shown in FIG. 17, transistor characteristics change and a leakage current in an off region increases. Therefore, since a leakage current of the writing transistor Tws increases in a case of introducing an external light to the writing transistor Tws, there has been a problem that an electric charge charged in the retention capacitor Cs leaks and a voltage Vgs between gate and source of the driving transistor Tdr decreases to decrease the brightness.

It is desirable to provide a display panel capable of reducing a decrease in brightness derived from an external light and a display device and an electronic instrument provided with the display panel.

A display panel according to an embodiment of the present disclosure is provided with, for each pixel, a self light emitting device and a pixel circuit driving the self light emitting device. The pixel circuit has a retention capacitor, a first transistor writing a voltage corresponding to a video signal in the retention capacitor, and a second transistor driving an organic EL device based on the voltage of the retention capacitor. The display panel according to an embodiment of the present disclosure further has a light exit face discharging a light emitted from the self light emitting device to outside and also has a light blocking layer blocking an external light introduced from the light exit face to the first transistor.

A display device according to an embodiment of the present disclosure is provided with a display panel having, for each pixel, a self light emitting device and a pixel circuit driving the self light emitting device and a driving circuit driving the pixel circuit. The display panel included in this display device has components identical to those of the above display panel. An electronic instrument according to an embodiment of the present disclosure is provided with the above display device.

A display panel, a display device, and an electronic instrument according to an embodiment of the present disclosure are equipped with a light blocking layer that blocks an external light introduced from the light exit face to the first transistor. This enables to prevent an external light from being introduced directly to the first transistor.

In an embodiment of the present disclosure, in a case that the display panel has a gate line connected to a gate of the first transistor, the light blocking layer may also be in the form of a strip extending in parallel with the gate line. At this time, in a case that the light blocking layer is in the form of a strip as described above, the light blocking layer is preferably configured with a metal material. In such a case, it becomes possible to input a predetermined signal to the light blocking layer from outside.

According to a display panel, a display device, and an electronic instrument of an embodiment of the present disclosure, since an external light is prevented from being introduced directly to a first transistor, it is possible to reduce an increase in a leakage current in the first transistor derived from an external light. As a result, it is possible to reduce a decrease in brightness derived from an external light.

In a case that the light blocking layer is metal wirings extending in parallel with the gate line in an embodiment of the present disclosure, when a plurality of detection lines extending in a direction across the light blocking layer is further equipped and the scanning signal to be inputted to the gate line is also inputted to the light blocking layer and also the detection signal is inputted to each detection line, the display panel can be functioned as a touch sensor.

BRIEF DESCRIPTION OF THE DRAWINGS

FIG. 14A is a front view of Application Example 5 in an open state,
FIG. 14B is a side view thereof,
FIG. 14C is a front view thereof in a close state,
FIG. 14D is a left side view thereof,
FIG. 14E is a right side view thereof,
FIG. 14F is a top view thereof,
and FIG. 14G is a bottom view thereof;
FIG. 15 is a schematic diagram of a display panel in the past.

DETAILED DESCRIPTION OF EMBODIMENTS

Figure 1:
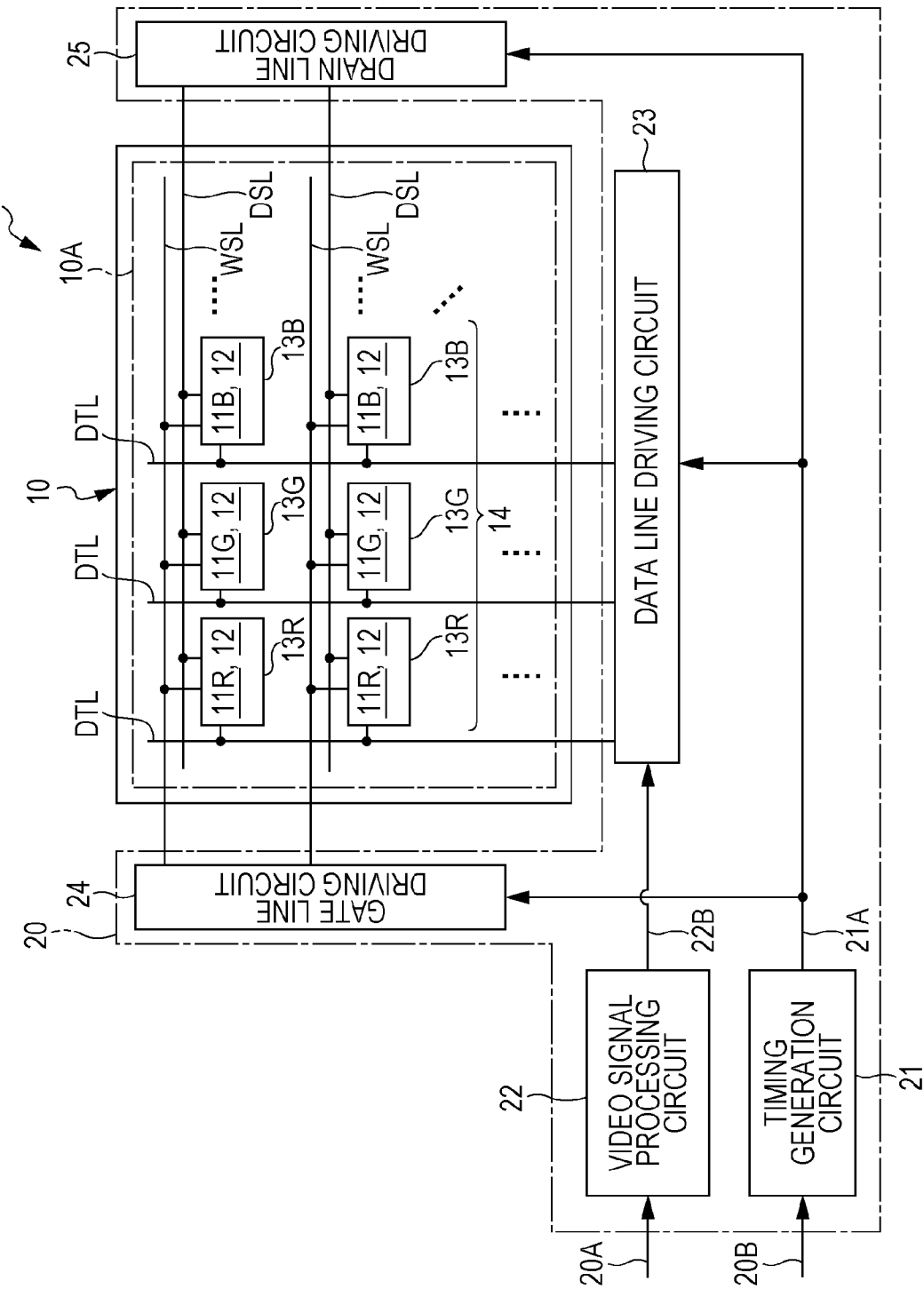
FIG. 1 is a schematic diagram of a display device according to an embodiment.

Embodiments of the present disclosure are described below in detail with reference to the drawings. The description is given in the following order.
1. Embodiment
An example in which a light blocking layer is equipped immediately below a writing transistor
2. Another Embodiment
An example in which a light blocking layer is used as a scanning electrode of a touch sensor
3. Module and Application Examples 1. Embodiment Configuration FIG. 1 represents an example of the overall configuration of a display device 1 according to an embodiment. This display device 1 is provided with a display panel 10 and a driving circuit 20 driving the display panel 10.

The display panel 10 has a display region 10A with a plurality of display pixels 14 two dimensionally arranged therein. The display panel 10 displays an image based on a video signal 20A inputted from outside by active matrix driving each display pixel 14. Each display pixel 14 includes a subpixel 13R for a red color, a subpixel 13G for a green color, and a subpixel 13B for a blue color. In the following description, a subpixel 13 is used as a generic name for the subpixels 13R, 13G, and 13B.

Figure 2:
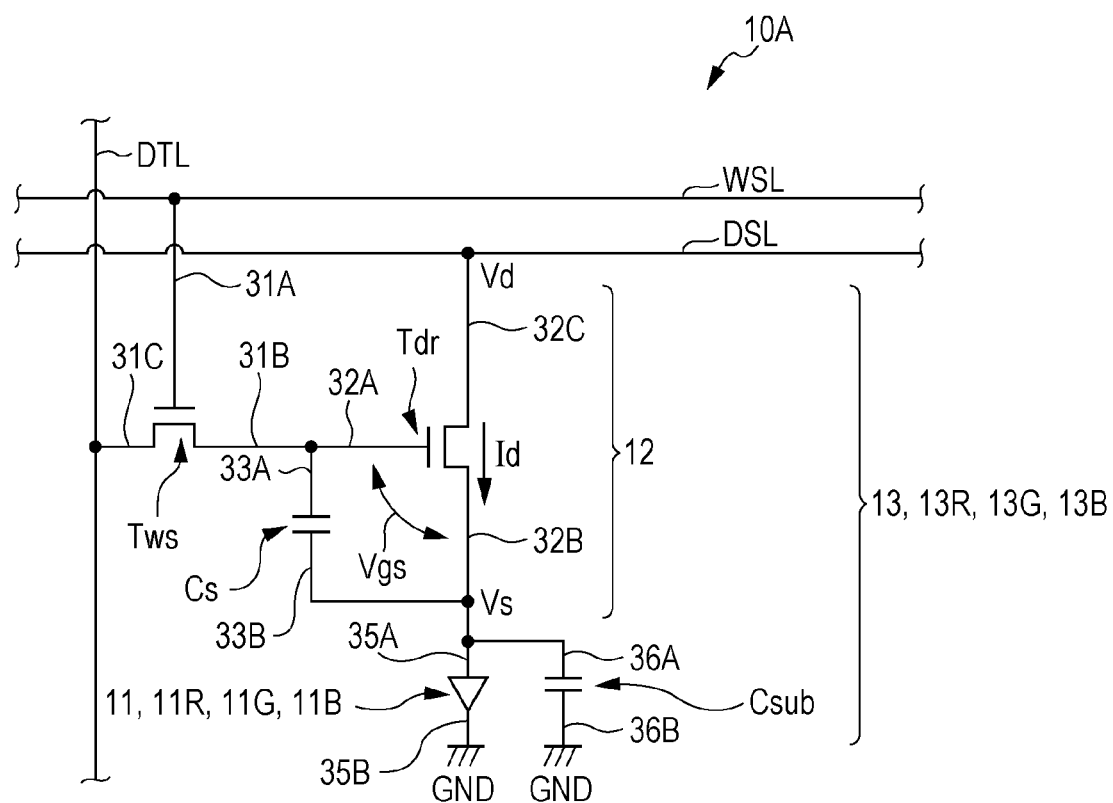
FIG. 2 is a circuit diagram of a subpixel in FIG. 1.

FIG. 2 represents an example of a circuit configuration of the subpixel 13. The subpixel 13 has, as shown in FIG. 2, an organic EL device 11, a capacitor Csub connected to the organic EL device 11 in parallel, and a pixel circuit 12 driving the organic EL device 11. The organic EL device 11 is equivalent to a specific example of a "self light emitting device". The subpixel 13R is equipped with an organic EL device 11R emitting a red light as the organic EL device 11. Similarly, the subpixel 13G is equipped with an organic EL device 11G emitting a green light as the organic EL device 11. The subpixel 13B is equipped with an organic EL device 11B emitting a blue light as the organic EL device 11.

The pixel circuit 12 is configured to include, for example, a writing transistor Tws, a driving transistor Tdr, and a retention capacitor Cs and has a circuit configuration of 2Tr1C. The pixel circuit 12 is not limited to the circuit configuration of 2Tr1C, and may also have two writing transistors Tws connected to each other in series and may also have a transistor or a capacitor other than the above description.

The writing transistor Tws is a transistor writing a voltage corresponding to a video signal in the retention capacitor Cs. The driving transistor Tdr is a transistor driving the organic EL device 11 based on the voltage of the retention capacitor Cs written by the writing transistor Tws. The transistors Tws and Tdr are configured with, for example, n channel MOS type thin film transistors (TFT). The transistors Tws and Tdr may also be configured with p channel MOS type TFTs.

The writing transistor Tws in the embodiment is equivalent to a specific example of a "first transistor", and the driving transistor Tdr in the embodiment is equivalent to a specific example of a "second transistor". The retention capacitor Cs in the embodiment is equivalent to a specific example of a "retention capacitor".

The driving circuit 20 has a timing generation circuit 21, a video signal processing circuit 22, a data line driving circuit 23, a gate line driving circuit 24, and a drain line driving circuit 25. The driving circuit 20 also has a data line DTL connected to an output of the data line driving circuit 23, a gate line WSL connected to an output of the gate line driving circuit 24, and a drain line DSL connected to an output of the drain line driving circuit 25. The driving circuit 20 further has a ground line GND connected to a cathode of the organic EL device 11. The ground line GND is connected to the ground and becomes a ground voltage (reference voltage) when connected to the ground.

The timing generation circuit 21 controls so as to operate, for example, the data line driving circuit 23, the gate line driving circuit 24, and the drain line driving circuit 25 in conjunction. The timing generation circuit 21 is designed to output a control signal 21A, in response to (synchronization with) a synchronization signal 20B inputted from outside, for example, to these circuits.

The video signal processing circuit 22 corrects a digital video signal 20A inputted from outside, for example, and also outputs a signal voltage 22B to the data line driving circuit 23 by converting the video signal after correction into analog.

The data line driving circuit 23 writes the analog signal voltage 22B inputted from the video signal processing circuit 22 in a display pixel 14 (or subpixel 13) subjected to selection via the respective data line DTL in response to (synchronization with) the input of the control signal 21A. The data line driving circuit 23 is capable of outputting, for example, the signal voltage 22B and a constant voltage unrelated to the video signal.

The gate line driving circuit 24 sequentially selects the plurality of display pixels 14 (or subpixels 13) per gate line WSL by sequentially applying a selection pulse to the plurality of gate lines WSL in response to (synchronization with) the input of the control signal 21A. The gate line driving circuit 24 is capable of outputting, for example, a voltage to be applied when turning on the writing transistor Tws and a voltage to be applied when turning off the writing transistor Tws.

The drain line driving circuit 25 is designed to output a predetermined voltage to a drain of the driving transistor Tdr of each pixel circuit 12 via the respective drain lines DSL in response to (synchronization with) the input of the control signal 21A. The drain line driving circuit 25 is capable of outputting, for example, a voltage to be applied when emitting a light of the organic EL device 11 and a voltage to be applied when extinguishing a light of the organic EL device 11.

Figure 3:
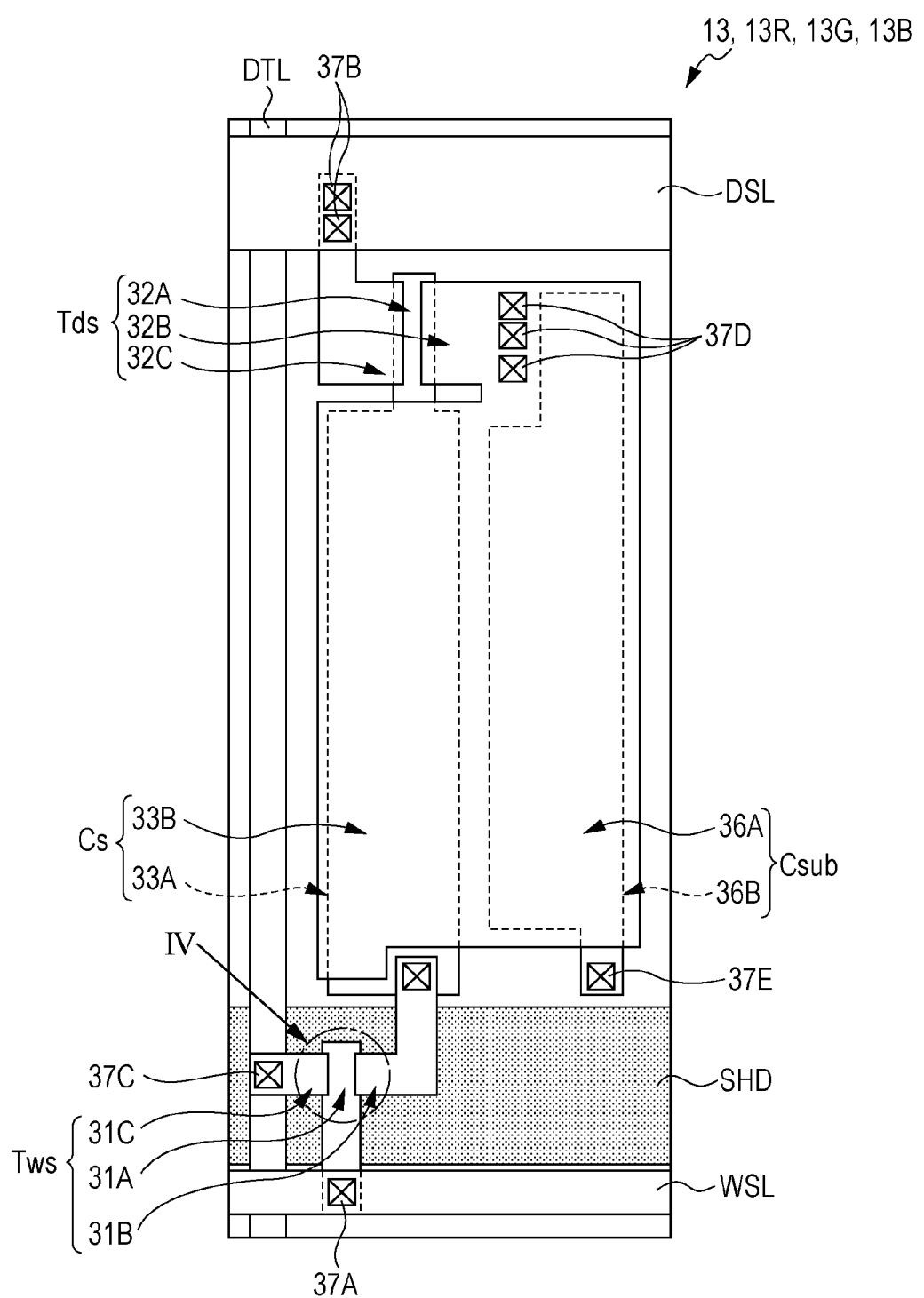
FIG. 3 is a layout diagram of a subpixel in FIG. 1.

Next, with reference to FIGS. 2 and 3, connection relationship and arrangement of each component are described. FIG. 3 represents an example of a layout of the subpixel 13.

The gate line WSL is formed to extend in a row direction and is connected to a gate 31A of the writing transistor Tws via a contact 37A. The drain line DSL is also formed to extend in a row direction and is connected to a drain 32C of the driving transistor Tdr via a contact 37B. The data line DTL is formed to extend in a column direction and is connected to a drain 31C of the writing transistor Tws via a contact 37C. A source 31B of the writing transistor Tws is connected to a gate 32A of the driving transistor Tdr and one end (terminal 33A) of the retention capacitor Cs. A source 32B of the driving transistor Tdr and the other end (terminal 33B) of the retention capacitor Cs are connected to an anode 35A of the organic EL device 11 via a contact 37D. A cathode 35B of the organic EL device 11 is connected to the ground line GND. One end (terminal 36A) of the capacitor Csub is connected to one end (terminal 33A) of the retention capacitor Cs, the source 31B of the driving transistor Tdr, and the anode 35A of the organic EL device 11. The other end (terminal 36B) of the capacitor Csub is connected to the ground line GND via a contact 37E.

Figure 4:
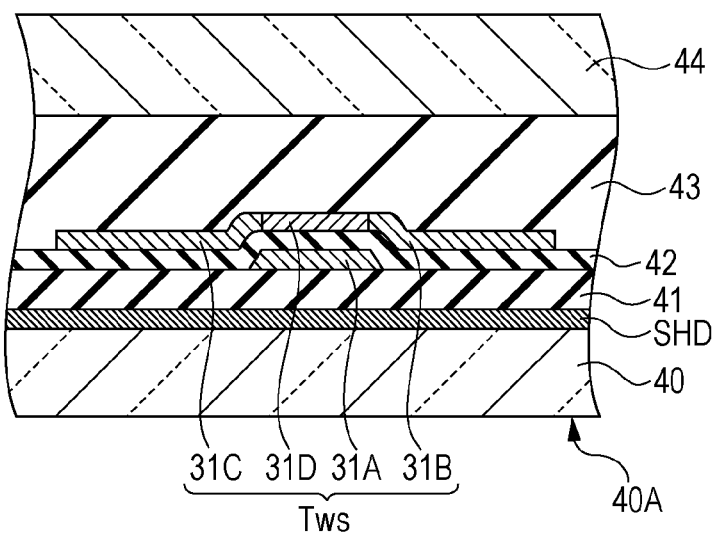
FIG. 4 is a cross-sectional view of a writing transistor in FIG. 3.

Next, the writing transistor Tws in the display panel 10 and a cross-sectional configuration in the vicinity thereof are described. FIG. 4 represents an example of a cross-sectional configuration of the writing transistor Tws in the display panel 10 and the vicinity (IV in FIG. 3) thereof. The display panel 10 has, as shown in FIG. 4 for example, a light blocking layer SHD, an insulating layer 41, a gate electrode 31A, a gate insulating film 42, a channel layer 31D, an insulating layer 43, and a substrate 44 on a substrate 40 in the writing transistor Tws and in the vicinity thereof in this order from the substrate 40 side. The display panel 10 further has, as shown in FIG. 4 for example, the drain 31C and the source 31B of the writing transistor Tws on both sides of the channel layer 31D. The drain 31C makes contact with one end of the channel layer 31D and the source 31B makes contact with the other end of the channel layer 31D.

Figure 5:
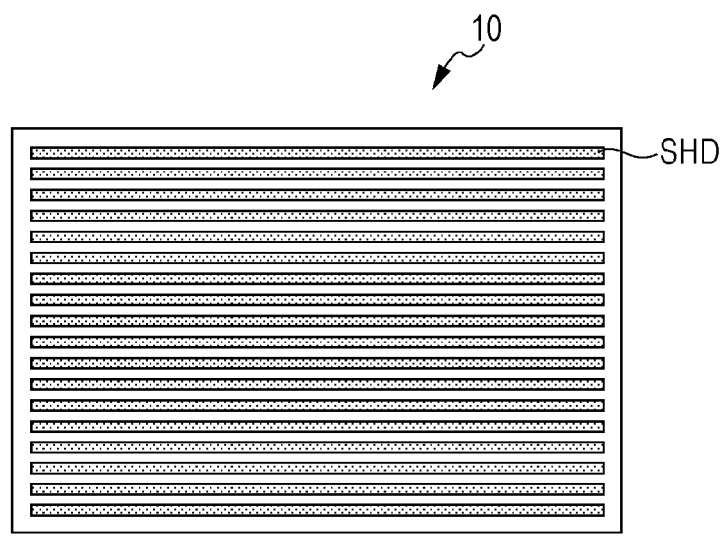
FIG. 5 is a layout diagram of a light blocking layer in FIG. 3.

The substrates 40 and 44 are made with, for example, a glass substrate, a silicon (Si) substrate, a resin substrate, or the like. The light blocking layer SHD is formed on the substrate 40 and specifically is arranged between the substrate 40 and the gate electrode 31A of the writing transistor Tws. The light blocking layer SHD is formed in a region facing at least the channel layer 31D and has a role of interrupting an external light introduced from the substrate 40 side to be introduced to the channel layer 31D. The light blocking layer SHD is configured with, for example, a metal material. The light blocking layer SHD extends, as shown in FIGS. 4 and 5 for example, in a row direction and is in the form of a strip extending in parallel with the gate line WSL. At this time, each light blocking layer SHD covers the channel layer 31D of each writing transistor Tws arranged in a line in a row direction. In a case that the writing transistor Tws has a LDD (lightly doped drain) structure, the light blocking layer SHD is preferably formed not only in the channel layer 31D but also in a region facing the LDD.

Operation and Effects

Next, an operation and effects of the display device 1 in the embodiment are described. In the display device 1 in the embodiment, the pixel circuit 12 is controlled to be turned on and off in each subpixel 13 and a driving current is injected into the organic EL device 11 of each subpixel 13, thereby occurring light emission due to recombination of holes and electrons. This light is taken out from a light exit face 40A equivalent to a back face of the substrate 40 transmitting through the cathode 35B and the substrate 40 to outside. As a result, an image is displayed in the display panel 10.

Figure 17:
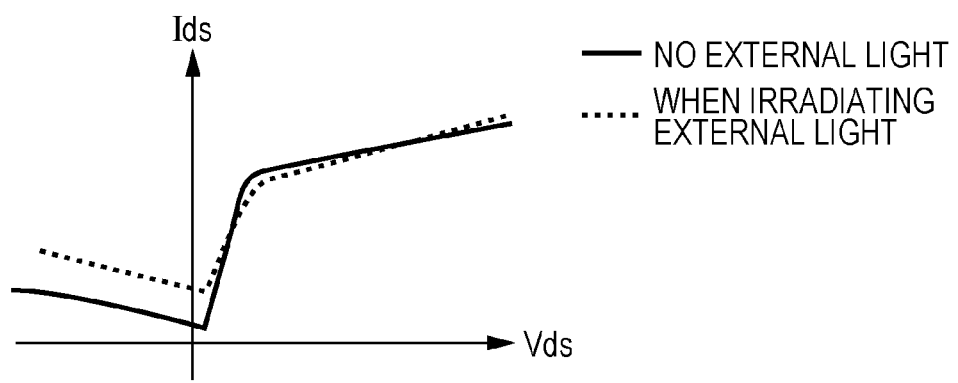
FIG. 17 is a characteristic diagram representing V-I characteristics of a subpixel in FIG. 15.

In a case that the display panel 10 has a bottom emission structure as the embodiment, the writing transistor Tws is arranged on the light exit face 40A side and the external light introduced from the light exit face 40A can be introduced directly to the transistor Tws. Normally, in a case of introducing a light to a transistor, as shown in FIG. 17, the transistor characteristics change and the leakage current in the off region increases. Therefore, in a case of introducing the external light to the writing transistor Tws, the leakage current of the writing transistor Tws increases, so that there has been a problem that the electric charge charged in the retention capacitor Cs leaks and the voltage Vgs between gate and source of the driving transistor Tdr decreases to decrease the brightness.

In contrast, the display device 1 in the embodiment is equipped with the light blocking layer SHD that blocks an external light introduced from the light exit face 40A to the writing transistor Tws. This enables to prevent an external light from being introduced directly to the writing transistor Tws. This enables to reduce an increase in the leakage current of the writing transistor Tws derived from the external light and to reduce a decrease in the brightness derived from the external light.

2. Another Embodiment

Configuration

Figure 6:
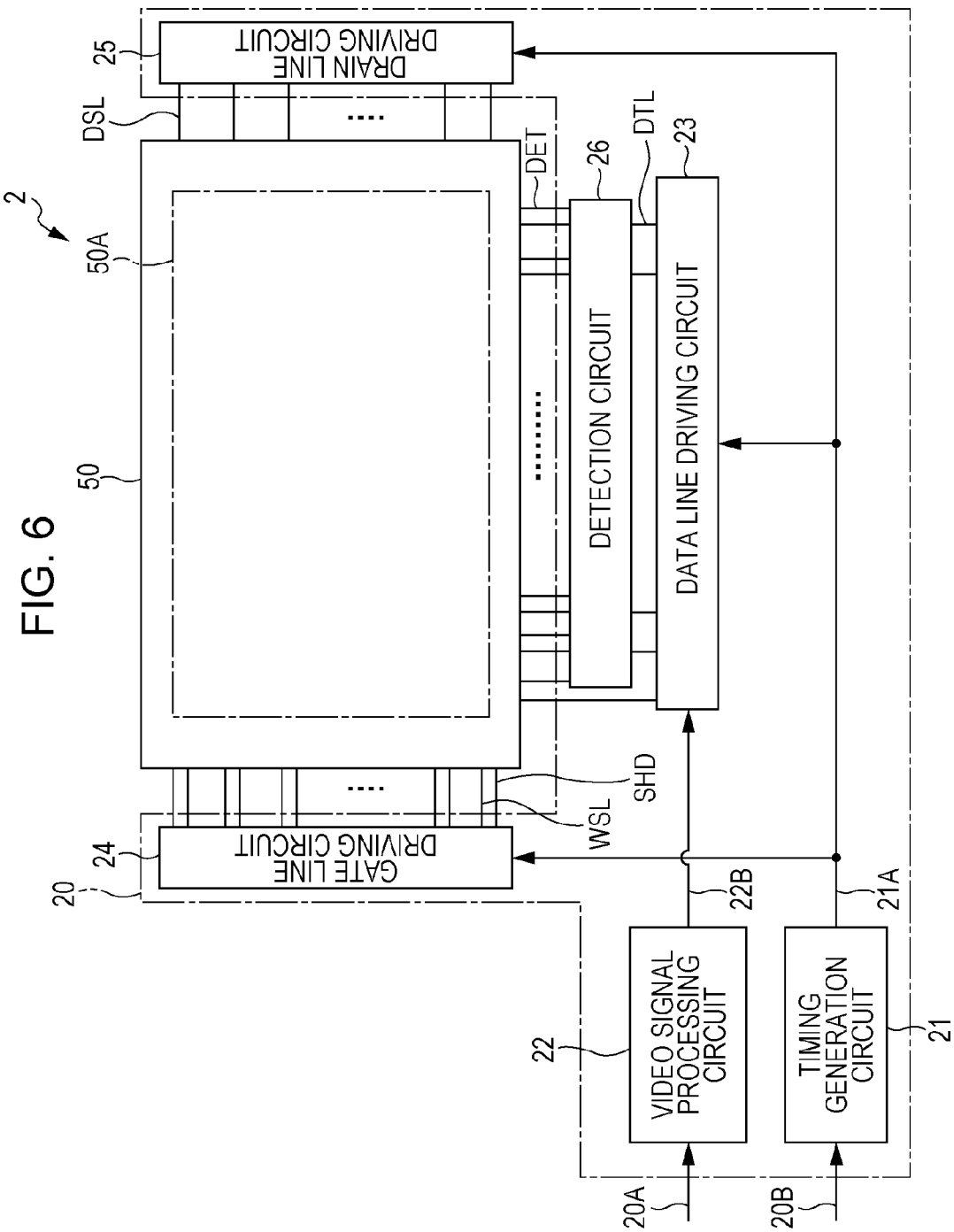
FIG. 6 is a schematic diagram of a display device according to another embodiment.

FIG. 6 represents an example of an overall configuration of a display device 2 according to another embodiment. This display device 2 is provided with a display panel 50 and a driving circuit 20 driving the display panel 50. This display device 2 is provided with a capacitance touch sensor inside the display panel 50. That is, the display panel 50 is a touch sensor built-in (in-cell) display panel.

Figure 7:
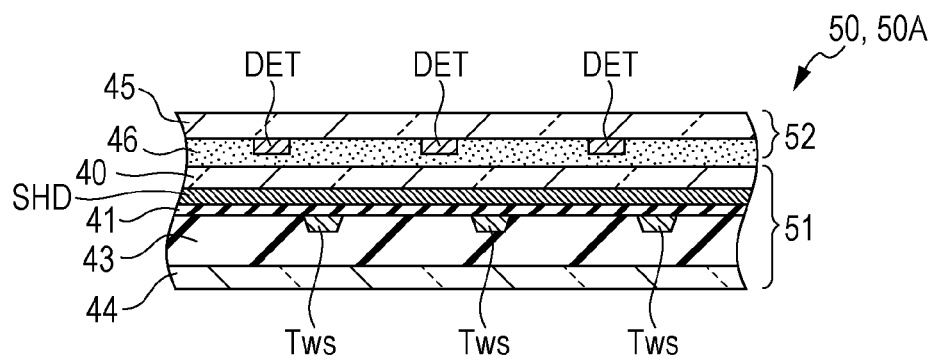
FIG. 7 is a cross-sectional view of a display panel in FIG. 6.

FIG. 7 represents an example of a cross-sectional configuration of the display panel 50. The display panel 50 has, as shown in FIG. 7, a laminated panel portion 51 configured to include, for example, a substrate 44, an insulating layer 43, subpixels 13 including writing transistors Tws, a light blocking layer SHD, and a substrate 40. This display panel 50 also has, as shown in FIG. 7, a detection panel portion 52 having, for example, a plurality of detection electrodes DET formed on a surface of a substrate 45. In this display panel 50, the laminated panel portion 51 and the detection panel portion 52 are bonded via an adhesion layer 46 so as to, for example, set the substrate 40 and the detection electrodes DET to each other.

Figure 8A:
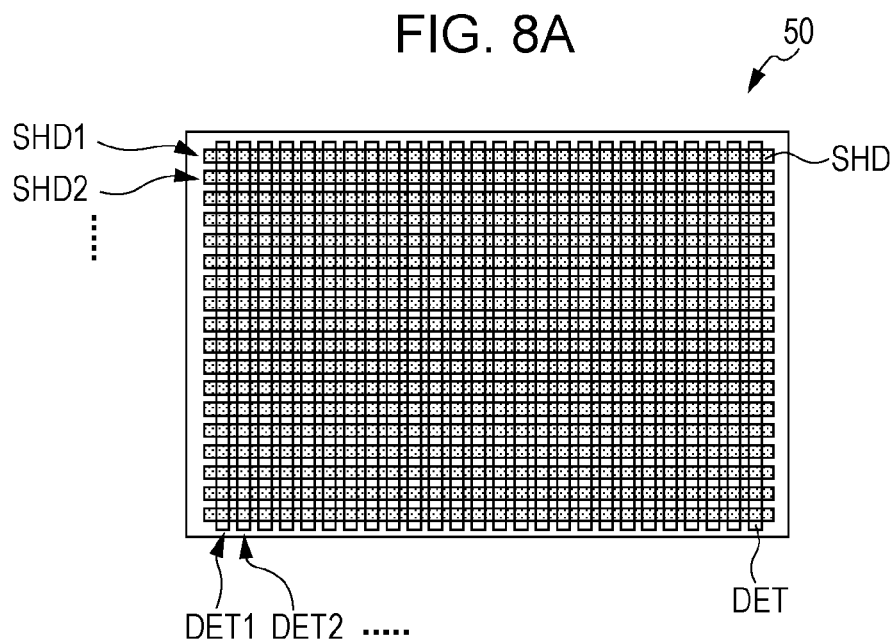
FIG. 8A is a layout diagram of a light blocking layer and a detection line in FIG. 6

The plurality of detection electrodes DET is formed, for example, to extend in a column direction as shown in FIG. 8A, and is across (for example, orthogonal to) the light blocking layer SHD.

Figure 8B:
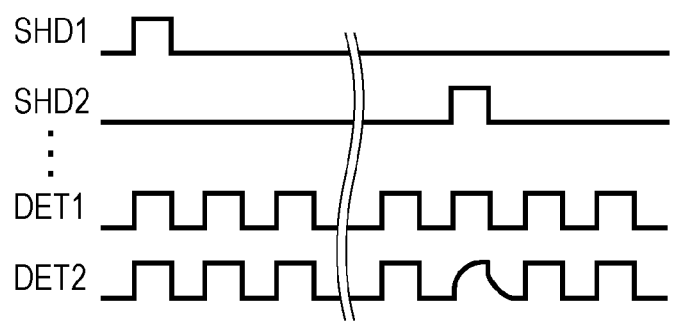
FIG. 8B is a waveform diagram of a scanning signal inputted to the light blocking layer and a detection signal detected from the detection line.

In the driving circuit 20 in the embodiment, the gate line driving circuit 24 is connected not only to each gate line WSL but also to each light blocking layer SHD and a selection pulse (for example, signal waveforms of SHD1 and SHD2 in FIG. 8B) is designed to be applied to each light blocking layer SHD. That is, in the embodiment, each light blocking layer SHD is used as a scanning electrode of the touch sensor.

In the embodiment, the driving circuit 20 has a detection circuit 26 connected to each detection electrode DET. The detection circuit 26 is designed, as illustrated in DET1 and DET2 in FIG. 8B for example, to apply a detection pulse to each detection electrode DET and to output voltage information of each detection electrode DET to outside. The detection circuit 26 is designed to output, in a case that an object, such as a finger for example, comes close to the detection electrode DET2, a waveform having distortion derived from a capacitance change due to the object coming close to the detection electrode DET2 to outside.

Effects

In the embodiment, the plurality of light blocking layers SHD are used as scanning electrodes of the touch sensor and the plurality of detection electrodes DET is equipped to extend in a direction across the light blocking layers SHD in the display panel 50. This enables to reduce a decrease in the brightness derived from an external light while imparting a function of a touch sensor with a simple configuration.

3. Module and Application Examples

Application examples of the display device 1 explained in the above embodiment are described below. The display device 1 is capable of being applied to a display device of an electronic instrument in any field of displaying a video signal inputted from outside, such as a television device, a digital camera, a laptop personal computer, and a portable terminal device like a mobile phone, or a video camera, or a video signal generated internally as an image or a video.

Module

Figure 9:
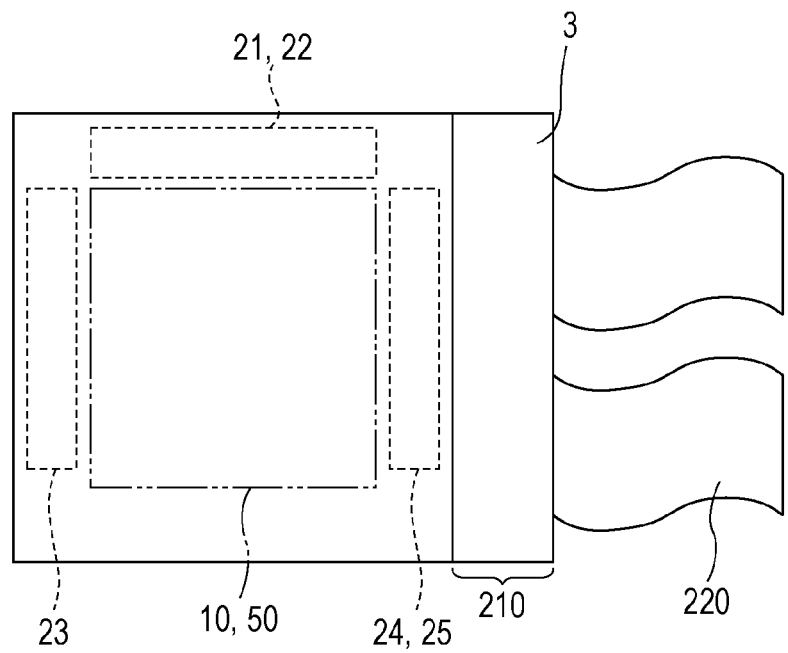
FIG. 9 is a plan view representing a schematic configuration of a module including a display device of each of the above embodiments.

The display device 1 is mounted in a variety of electronic instruments, such as Application Examples 1 through 5 described later, as a module shown in FIG. 9, for example. This module has a region 210 exposed from a member (not shown) sealing the display panel 10, 50 equipped with one side of a substrate 3, for example, and has an external connection terminal (not shown) formed in this exposed region 210 by extending wirings of the timing generation circuit 21, the video signal processing circuit 22, the data line driving circuit 23, the gate line driving circuit 24, and the drain line driving circuit 25. The external connection terminal may be equipped with a flexible printed circuit (FPC) board 220 for an input and an output of a signal.

Application Example 1

Figure 10:
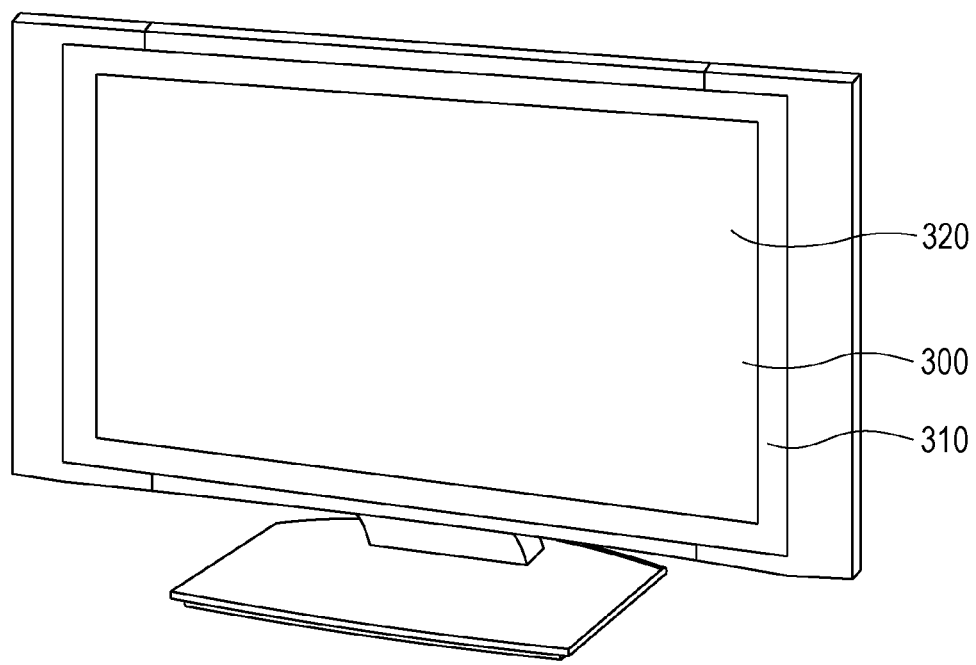
FIG. 10 is a perspective view representing appearance of Application Example 1 of a display device of the above embodiments.

FIG. 10 represents appearance of a television device to which the display device 1 is applied. This television device has a video display screen unit 300 including, for example, a front panel 310 and a filter glass 320 and the video display screen unit 300 is configured with the display device 1.

Application Example 2

Figure 11A:
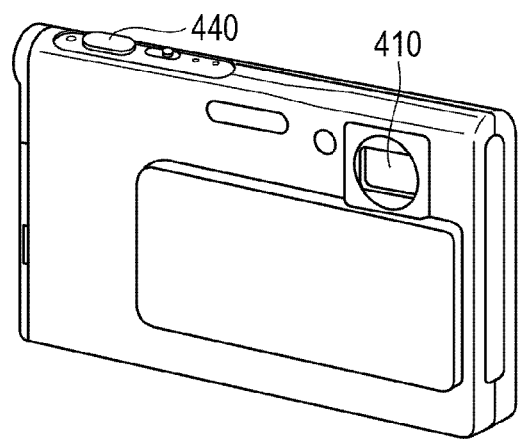
FIG. 11A is a perspective view representing appearance of Application Example 2 taken from a front side and FIG. 11B is a perspective view representing the appearance taken from a back side.
Figure 11B:
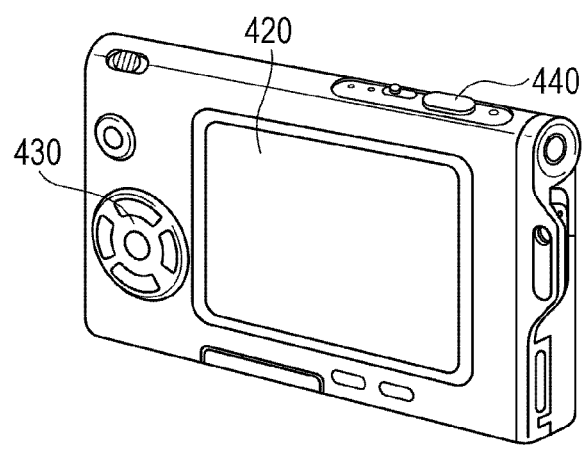

FIGS. 11A and 11B represent appearance of a digital camera to which the display device 1 is applied. This digital camera has, for example, a light emission unit 410 for flash, a display unit 420, a menu switch 430, and a shutter button 440, and the display unit 420 is configured with the display device 1.

Application Example 3

Figure 12:
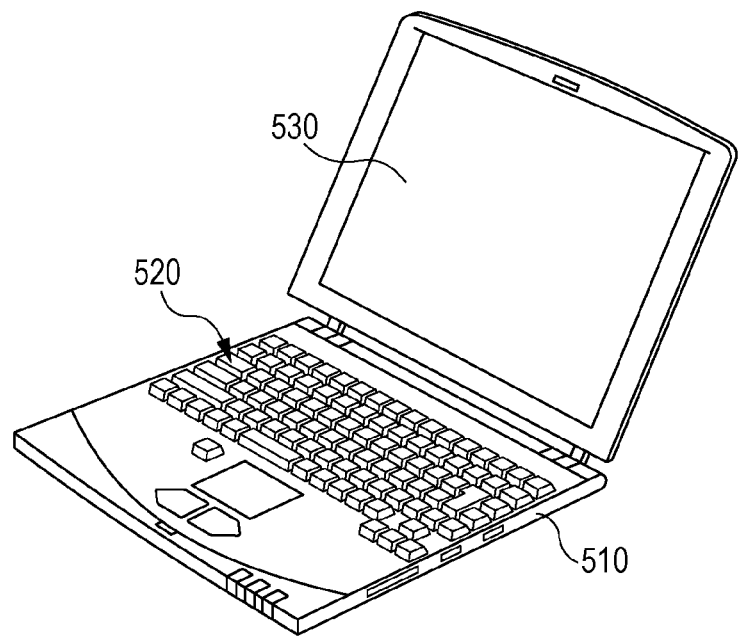
FIG. 12 is a perspective view representing appearance of Application Example 3.

FIG. 12 represents appearance of a laptop personal computer to which the display device 1 is applied. This laptop personal computer has, for example, a main body 510, a keyboard 520 for an input operation of characters and the like, and a display unit 530 displaying an image, and the display unit 530 is configured with the display device 1.

Application Example 4

Figure 13:
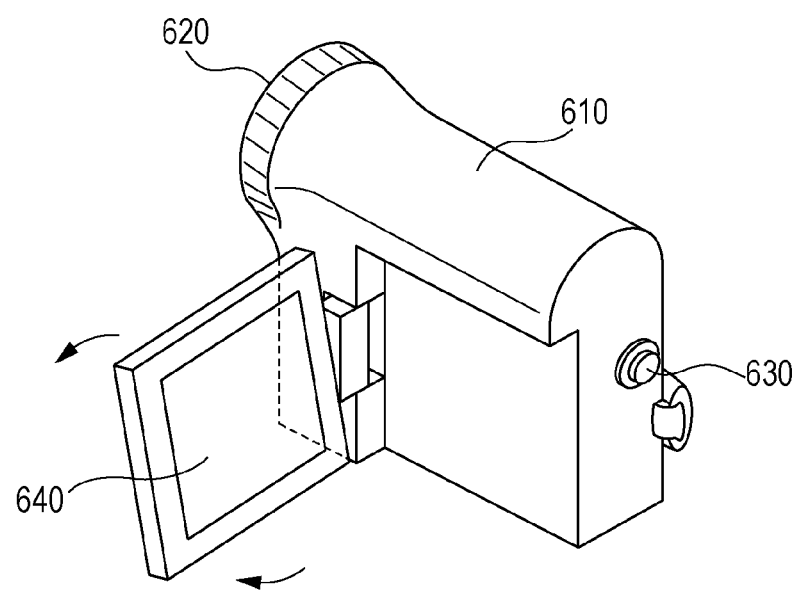
FIG. 13 is a perspective view representing appearance of Application Example 4.
Figure 16:
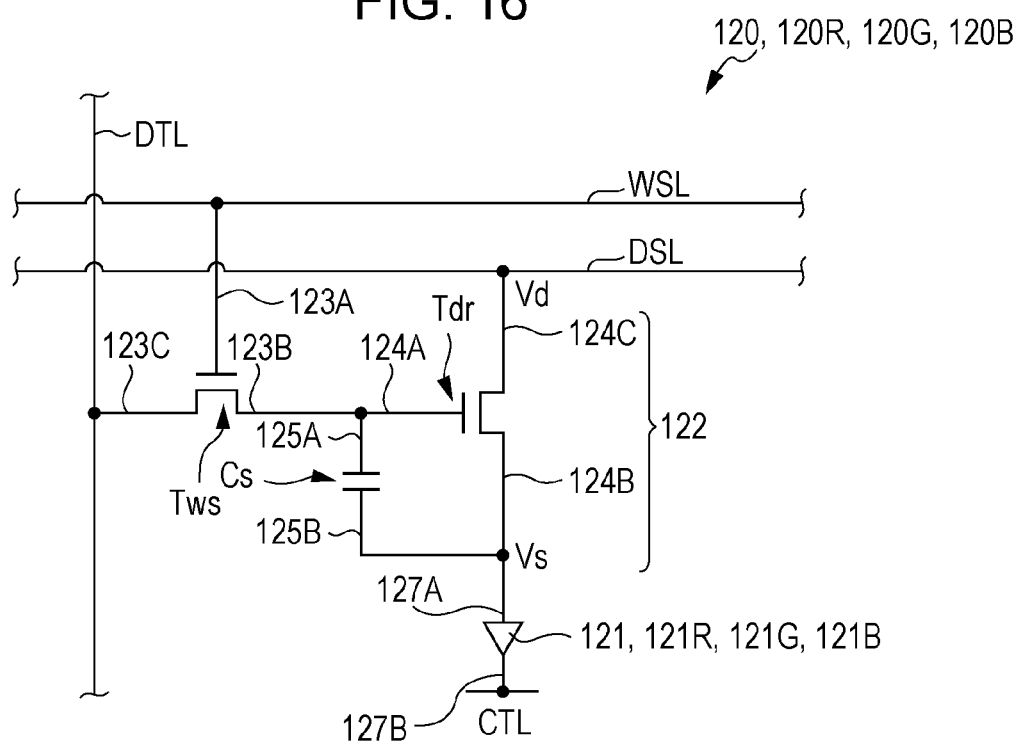
FIG. 16 is a circuit diagram of a subpixel in FIG. 15.

FIG. 13 represents appearance of a video camera to which the display device 1 is applied. This video camera has, for example, a main body unit 610, a lens 620 for subject image pickup equipped on a front side of the main body unit 610, a start/stop switch 630 for image pickup, and a display unit 640, and the display unit 640 is configured with the display device 1.

Application Example 5

FIGS. 14A through 14G represent appearance of a mobile phone to which the display device 1 is applied. This mobile phone includes, for example, an upper housing 710 and a lower housing 720 coupled with a coupling unit (hinge unit) 730, and has a display 740, a subdisplay 750, a picture light 760, and a camera 770. The display 740 or the subdisplay 750 is configured with the display device 1.

While embodiments of the present disclosure are explained by way of the respective embodiment and application example above, embodiments of the present disclosure are not limited to them and a variety of modifications is available.

For example, while the above embodiments explain a case that the display device is an active matrix type, the configuration of the pixel circuit 12 for active matrix driving is not limited to those explained in the above embodiments. Accordingly, it is possible to add a capacitive element or a transistor to the pixel circuit 12 as desired. In that case, in accordance with an alteration in the pixel circuit 12, a desired driving circuit may also be added other than the timing generation circuit 21, the video signal processing circuit 22, the data line driving circuit 23, the gate line driving circuit 24, and the drain line driving circuit 25 described above. In this case, when there is a plurality of transistors equivalent to the writing transistors Tws, the light blocking layer SHD may be equipped to at least one of the plurality of writing transistors Tws and the light blocking layers SHD are preferably equipped to all.

In addition, while driving of the data line driving circuit 23, the gate line driving circuit 24, and the drain line driving circuit 25 is controlled by the timing generation circuit 21 and the video signal processing circuit 22 in the above embodiments, another circuit may also control the driving of them. The control of the data line driving circuit 23, the gate line driving circuit 24, and the drain line driving circuit 25 may also be carried out by hardware (circuit) and may also be carried out by software (program).

While the source and the drain of the writing transistor Tws and the source and the drain of the driving transistor Tdr are described to be fixed in the above embodiments, the relationship of facing the source and the drain may become naturally opposite to the above description depending on the direction of a current flow.

While the above embodiments describe a case of inputting a selection pulse sequentially for each line to the light blocking layer SHD, a selection pulse may also be inputted sequentially for each plurality of lines to the light blocking layer SHD. In this case, the gate line driving circuit 24 may input a selection pulse of, for example, one line out of the commonalized lines to the light blocking layer SHD.

While the writing transistor Tws and the driving transistor Tdr are described to be formed with an n channel MOS type TFT in the above embodiments, at least one of the writing transistor Tws and the driving transistor Tdr may also be formed with a p channel MOS type TFT. In a case that the driving transistor Tdr is formed with a p channel MOS type TFT, the anode 35A of the organic EL device 11 becomes a cathode and the cathode 35B of the organic EL device 11 becomes an anode in the above embodiments or the like. In the above embodiments, the writing transistor Tws and the driving transistor Tdr do not have to be an amorphous silicon type TFT or a micro silicon type TFT in all cases, and they may also be, for example, a low-temperature polysilicon type TFT.

The present disclosure contains subject matter related to that disclosed in Japanese Priority Patent Application JP 2011-072246 filed in the Japan Patent Office on Mar. 29, 2011, the entire contents of which are hereby incorporated by reference.

What is claimed is:
1. A display panel comprising:
a plurality of pixels, wherein each pixel of the plurality of pixels includes a light emitting device;
a pixel circuit configured to drive the light emitting device, wherein the pixel circuit includes a retention capacitor, a first transistor configured to write a voltage corresponding to a video signal to the retention capacitor, a second transistor configured to drive the light emitting device based on the voltage of the retention capacitor, and a gate line connected to the gate of the first transistor and formed to extend in a row direction;
a light exit face configured to discharge a light emitted from the light emitting device; and
a plurality of light blocking layers, each light blocking layer of the plurality of light blocking layers formed as a strip extending parallel with the gate line and across the display panel, wherein at least one light blocking layer of the plurality of light blocking layers is configured to block an external light, introduced from the light exit face, from reaching a channel layer of the first transistor, and wherein a gate of the first transistor is located between the channel layer and the at least one light blocking layer.

2. A display device comprising:
a display panel including a plurality of pixels, wherein each pixel of the plurality of pixels includes a light emitting device and a pixel circuit configured to drive the light emitting device; and
a driving circuit configured to drive the pixel circuit wherein the pixel circuit includes a retention capacitor, a first transistor configured to write a voltage corresponding to a video signal to the retention capacitor, a second transistor configured to drive the light emitting device based on the voltage of the retention capacitor, and a gate line connected to the gate of the first transistor and formed to extend in a row direction,
wherein the display panel includes a light exit face configured to discharge a light emitted from the light emitting device and a plurality of light blocking layers, each light blocking layer of the plurality of light blocking layers formed as a strip extending parallel with the gate line and across the display panel, wherein at least one light blocking layer of the plurality of light blocking layers is configured to block an external light introduced from the light exit face, from reaching a channel layer of the first transistor, and wherein a gate of the first transistor is located between the channel layer and the at least one light blocking layer.

3. The display device according to claim 2, wherein at least one light blocking layer is configured with a metal material.

4. The display device according to claim 3, wherein the driving circuit is configured to output a selection pulse to both the gate line and the at least one light blocking layer.

5. An electronic instrument comprising a display device, wherein the display device includes:
a display panel including a plurality of pixels, wherein each pixel of the plurality of pixels includes a light emitting device and a pixel circuit configured to drive the light emitting device; and
a driving circuit configured to drive the pixel circuit, wherein the pixel circuit includes a retention capacitor, a first transistor configured to write a voltage corresponding to a video signal to the retention capacitor, a second transistor configured to drive the light emitting device based on the voltage of the retention capacitor, and a gate line connected to the gate of the first transistor and formed to extend in a row direction,
wherein the display panel includes a light exit face configured to discharge a light emitted from the light emitting device and a plurality of light blocking layers, each light blocking layer of the plurality of light blocking layers formed as a strip extending parallel with the gate line and across the display panel, wherein at least one light blocking layer of the plurality of light blocking layers is configured to block an external light introduced from the light exit face, from reaching a channel layer of the first transistor, and wherein a gate of the first transistor is located between the channel layer and the at least one light blocking layer.

6. The display panel according to claim 1, further comprising a touch sensor, wherein a scanning electrode of the touch sensor includes the at least one light blocking layer.

7. The display panel according to claim 6, wherein at least one light blocking layer includes a metal material.

8. The display panel according to claim 7, further comprising a driving circuit configured to output a selection pulse to both the gate line and the at least one light blocking layer.

9. The display device according to claim 2, further comprising a touch sensor, wherein a scanning electrode of the touch sensor includes the at least one light blocking layer.

10. The electronic instrument according to claim 5, further comprising a touch sensor, wherein a scanning electrode of the touch sensor includes the at least one light blocking layer.

11. The electronic instrument according to claim 10, further comprising a driving circuit configured to output a selection pulse to both the gate line and the at least one light blocking layer.

12. The electronic instrument according to claim 5, wherein the at least one light blocking layer includes a metal material.

\* \* \* \* \*